(12) United States Patent
Kawaguchi

(10) Patent No.: US 7,781,124 B2
(45) Date of Patent: *Aug. 24, 2010

(54) HOLOGRAM RECORDING MATERIAL

(75) Inventor: Yoshihide Kawaguchi, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 688 days.

This patent is subject to a terminal disclaimer.

(21) Appl. No.: 11/631,189

(22) PCT Filed: Apr. 6, 2006

(86) PCT No.: PCT/JP2006/307317

§ 371 (c)(1),
(2), (4) Date: Dec. 29, 2006

(87) PCT Pub. No.: WO2006/109665

PCT Pub. Date: Oct. 19, 2006

(65) Prior Publication Data

US 2008/0305404 A1    Dec. 11, 2008

(30) Foreign Application Priority Data

Apr. 8, 2005   (JP) .............................. 2005-112136

(51) Int. Cl.
G03H 1/02 (2006.01)
(52) U.S. Cl. .................... 430/1; 430/2; 430/281.1; 430/287.1; 359/3
(58) Field of Classification Search ................. None
See application file for complete search history.

(56) References Cited

U.S. PATENT DOCUMENTS 3,652,275 A * 3/1972 Baum et al. ................. 430/269

(Continued)

FOREIGN PATENT DOCUMENTS

CN    1065468 A    10/1992

(Continued)

OTHER PUBLICATIONS

Tomlinson et al., Photoinduced Refractive Index Increase in Poly and its Applications, Applied Physics Letters, Jun. 15, 1970, vol. 16, p. 486.

(Continued)

*Primary Examiner*—Martin J Angebranndt
(74) *Attorney, Agent, or Firm*—Sughrue Mion, PLLC

(57) ABSTRACT

The present invention provides a hologram recording material which can modulate its refractive index effectively with visible light laser and is excellent also in transparency after this modulation. The present invention relates to a hologram recording material comprising a polymer (A) having a radically polymerizable side chain vinyl group in the molecule thereof, said polymer (A) being a polymer of monomers comprising as an essential component an acryl-vinyl monomer represented by the following formula (1):

$$CH_2=C(R^1)C(=O)O-R^2=CH_2 \quad (1)$$

wherein $R^1$ represents a hydrogen atom or methyl group, and $R^2$ represents a saturated or unsaturated hydrocarbon group having 1 to 20 carbon atoms, which may contain hetero atoms or halogen atoms in the molecule thereof; and a photopolymerization initiation source (B) which generates an active seed by visible light, and particularly relates to a hologram recording material having the aforementioned constitution in which the aforementioned photopolymerization initiation source (B) is a photopolymerization initiator which absorbs visible light to generate an active seed or a mixture of visible light-sensitizing dye and photopolymerization initiator.

12 Claims, 2 Drawing Sheets

U.S. PATENT DOCUMENTS

| | | | |
|---|---|---|---|
| 3,658,526 A * | 4/1972 | Haugh | 430/1 |
| 4,173,474 A * | 11/1979 | Tanaka et al. | 430/1 |
| 4,293,674 A | 10/1981 | Andrews | |
| 4,415,651 A * | 11/1983 | Proskow | 430/277.1 |
| 4,942,102 A * | 7/1990 | Keys et al. | 430/1 |
| 4,957,852 A * | 9/1990 | Bronstert | 430/283.1 |
| 5,886,101 A * | 3/1999 | Sommerfeld et al. | 525/112 |
| 6,214,101 B1 * | 4/2001 | Nakaseko | 106/35 |
| 6,228,919 B1 | 5/2001 | Sommerfield | |
| 2002/0095010 A1 | 7/2002 | Cai et al. | |
| 2004/0136038 A1 * | 7/2004 | Holmes et al. | 359/15 |
| 2007/0066705 A1 * | 3/2007 | Kawaguchi et al. | 522/178 |
| 2007/0128523 A1 * | 6/2007 | Kawaguchi et al. | 430/1 |

FOREIGN PATENT DOCUMENTS

| | | |
|---|---|---|
| JP | 62-22152 A | 1/1987 |
| JP | 62-22152 B2 | 5/1987 |
| JP | 7-92313 A | 4/1995 |
| JP | 9-178901 A | 7/1997 |
| JP | 10-273505 A | 10/1998 |
| JP | 11-249298 A | 9/1999 |
| JP | 2002-322207 A | 11/2002 |
| JP | 2005-126688 * | 5/2005 |
| JP | 2006-188631 * | 7/2006 |
| WO | WO 2005/033153 A1 | 4/2005 |

OTHER PUBLICATIONS

Bowden et al., Mechanism of the Photoinduced Refractive Index Increase in Polymethyl Methacrylate, Applied Optics, Jan. 1974, vol. 16, p. 113.

Chinese Office Action dated Dec. 5, 2008.

* cited by examiner

HOLOGRAM RECORDING MATERIAL

TECHNICAL FIELD

The present invention relates to a hologram recording material comprising a refractive index modulation polymer composition having a high sensitivity over a wide wavelength range, a high chemical stability and an excellent operability.

BACKGROUND ART

Because of the capability of recording and reproducing three-dimensional stereoscopic image, a hologram has been used for cover paper for book, magazine and the like; display for POP and the like; gift and the like by making use of its excellent design and decorative effect. Further, because of its capability of recording fine data in a submicron unit, a hologram has been applied to mark for preventing forgery of securities, credit cards, prepaid cards, and the like.

In particular, a volume phase hologram forms spatial interference bands having different refractive indexes in a hologram recording material to allow the modulation of light transmitted by the hologram thus formed and thus has been expected to be applied to scanner for POS and holographic optical element (HOE) such as head up display (HUD) besides display.

In order to meet requirements for such a volume phase hologram, a volume phase hologram recording utilizing a photopolymer has been so far proposed.

Specifically, as a process for the production of a hologram employing a photopolymer, there has been proposed a process which comprises exposing a hologram recording material composed of a photopolymer to an interference pattern of radiation, and then subjecting the hologram recording material to development with a developer.

For example, there is disclosed a process for the production of a hologram employing a photopolymer, which comprises a first step of exposing a photographic material comprising a polyfunctional monomer having two or more ethylenically unsaturated bonds and a photopolymerization initiator incorporated in combination in a polymer as a carrier to an interference band of radiation, a second step of treating the photographic material with a first solvent so that it swells with the solvent, and a third step of treating the photographic material with a second solvent having a poor swelling effect so that it shrinks (see Patent Document 1).

In accordance with this conventional technique, a hologram excellent in diffraction efficiency, resolution, environmental resistance, etc. can be produced. However, this method is disadvantageous in that the hologram has poor sensitivity properties or poor properties of sensitive wavelength and it is subject to production complicatedness such as employment of wet step and problems such as deterioration of transparency due to development unevenness or whitening caused by void or cracking generated during dipping in solvent.

On the other hand, there are disclosed a hologram recording material employing a photopolymer capable of producing a hologram by interference exposure alone as only treatment step, which does not require complicate or troublesome wet step during the production of the hologram, and a process for the production thereof. For example, a hologram recording photosensitive layer comprising an aliphatic polymer binder, an aliphatic acryl monomer and a photopolymerization initiator is proposed (Patent Document 2).

However, this conventional technique is disadvantageous in that the high molecular polymer and aliphatic acryl monomer used have close refractive indexes and the modulation of refractive index attained by hologram exposure thus ranges from 0.001 to 0.003, making it impossible to obtain a high diffraction efficiency.

Further, it has been heretofore been attempted to raise the refractive index of a polymethyl methacrylate (PMMA), which is known as a representative optical polymer, only by irradiation of light, without introducing any low molecular compounds. Although this technique can provide a refractive index difference of 0.051, which is great enough for optical devices, in the case of being irradiated with light of 325 nm, it is disadvantageous in that in order to provide PMMA with reactivity, methyl methacrylate which is a monomer has been previously oxidized before being polymerized, requiring a long period of time to prepare PMMA and complicated steps.

It has been reported that, when methyl methacrylate which is a monomer has not been previously oxidized before being polymerized, the refractive index of PMMA shows no rise even when irradiated with the aforementioned light (see Non-patent Document 1). Further, it is reported that, when the wavelength of the light with which PMMA is irradiated is lowered, e.g., to 0.2537 µm, there is a tendency that the main chain of PMMA is severed to reduce the density thereof (see Non-patent Document 2), suggesting that the refractive index of PMMA cannot be raised from the standpoint of Lorenz-Lorenz equation.

Further, with regard to inorganic materials, a method which comprises irradiating glass doped with germanium with light so that the refractive index thereof varies to prepare a light diffraction lattice has been known. Moreover, with regard to polymer materials, a technique which comprises irradiating a material having a photochemically reactive low molecular material dispersed in a polymer with laser beam so that a photochromic reaction (photobleaching) is induced accompanied by the change of refractive index to prepare a light diffraction lattice has been disclosed (see Patent Document 3). Moreover, a technique which comprises using the aforementioned photobleaching to produce a so-called refractive index-distributed material (GRIN material) having a continuous change of refractive index therein has been disclosed (see Patent Document 4).

These conventional techniques involve the use of a material doped with a low molecular material or a polymer molecule having a low molecular material incorporated therein, and in some cases, light absorption by the low molecular material increases, occasionally making it impossible to obtain a sufficient device transparency.

Patent Document 1: JP-B-62-22152

Patent Document 2: U.S. Pat. No. 3,658,526

Patent Document 3: JP-A-7-92313

Patent Document 4: JP-A-9-178901

Non-patent Document 1: M. J. Bowden, E. A. Chandross, I. P. Kaminow, "Applied Optics", vol. 13, p. 113 (1974)

Non-patent Document 2: W. J. Tomlinson, I. P. Kaminow, E. A. Chandross, R. L. Fork, W. T. Silvast, "Applied Physics Letters", vol. 16, p. 486 (1970)

DISCLOSURE OF THE INVENTION

Problems that the Invention is to Solve

As mentioned above, various materials have been heretofore proposed which is irradiated with light to modulate refractive index and form a hologram. However, there have been problems that they require much time or complicated procedure to prepare or cannot satisfy requirements for transparency after being irradiated with light.

In view of these circumstances, an object of the present invention is to provide a hologram recording material which can efficiently modulate (vary) refractive index upon irradiation with visible light laser and exhibits an excellent transparency after the modulation without requiring any aforementioned conventional complicated procedure.

Means for Solving the Problems

The present inventors made extensive studies to solve the aforementioned problems. As a result, they found a method for efficiently obtaining a polymer having a radically polymerizable side chain vinyl group in the molecule thereof using a specific polymerizing method and also found that, when this polymer is mixed with a specific photopolymerization initiation source, interference exposure to laser beam in the visible light range causes the radically polymerizable side chain vinyl group to undergo crosslinking reaction that increases the density change, making it possible to obtain a hologram recording material which can efficiently change (increase) the refractive index and is also excellent in transparency after the change. Thus, the present invention has been completed.

Namely, the present invention relates to a hologram recording material comprising:

a polymer (A) having a radically polymerizable side chain vinyl group in the molecule thereof, said polymer (A) being a polymer of monomers comprising as an essential component an acryl-vinyl monomer represented by the following formula (1):

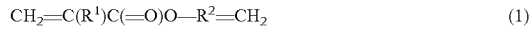
$$CH_2=C(R^1)C(=O)O-R^2=CH_2 \quad (1)$$

wherein $R^1$ represents a hydrogen atom or methyl group, and $R^2$ represents a saturated or unsaturated hydrocarbon group having 1 to 20 carbon atoms, which may contain hetero atoms or halogen atoms in the molecule thereof; and a photopolymerization initiation source (B) which generates an active seed by visible light. Especially, the present invention relates to a hologram recording material having the aforementioned constitution, wherein the polymer (A) is a polymer of monomers comprising an acryl-vinyl monomer represented by the formula (1) in an amount of 20 mol % or more; a hologram recording material having the aforementioned constitution, wherein the polymer (A) has a stereoregularity of 70% or more in terms of syndiotacticity (rr); and a hologram recording material having the aforementioned constitution, wherein the weight-average molecular weight of the polymer (A) is 80,000 or less.

The present invention also can provide a hologram recording material having the aforementioned constitution, wherein the photopolymerization initiation source (B) is a photopolymerization initiator which absorbs visible light to generate an active seed; a hologram recording material having the aforementioned constitution, wherein the photopolymerization initiation source (B) comprises a visible light-sensitizing dye and a photopolymerization initiator; a hologram recording material having the aforementioned constitution, wherein the amount of the photopolymerization initiator is from 1 to 50% by weight based on the total weight of the hologram recording material; and a hologram recording material having the aforementioned constitution, wherein the content of the visible light-sensitizing dye is from 0.1 to 10% by weight based on the total weight of the hologram recording material.

The present invention further can provide a hologram recording material having the aforementioned constitution, which further comprises a monomer (C) containing an ethylenically unsaturated bond in addition to the polymer (A) and the photopolymerization initiation source (B); a hologram recording material having the aforementioned constitution, wherein the ethylenically unsaturated bond-containing monomer (C) has a refractive index which is different from that of the polymer (A) by 0.005 or more; and a hologram recording material having the aforementioned constitution, which further comprises a plasticizer and/or a chain transfer agent in addition to the polymer (A), the photopolymerization initiation source (B) and an optional ethylenically unsaturated bond-containing monomer (C).

The present invention still further relates to a process for producing a hologram recording material, which comprises:

subjecting monomers comprising as an essential component an acryl-vinyl monomer represented by the following formula (1):

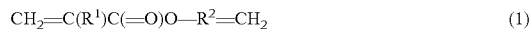
$$CH_2=C(R^1)C(=O)O-R^2=CH_2 \quad (1)$$

wherein $R^1$ represents a hydrogen atom or methyl group; and $R^2$ represents a saturated or unsaturated hydrocarbon group having 1 to 20 carbon atoms, which may contain hetero atoms or halogen atoms in the molecule thereof to anionic polymerization using, as a polymerization initiator, a metal complex catalyst comprising a rare earth metal as an active center to produce a polymer (A) having a radically polymerizable side chain vinyl group in the molecule thereof; and incorporating a photopolymerization initiation source (B) which generates an active seed by visible light into the polymer (A) to thereby produce a hologram recording material.

In particular, the present invention can provide a process for producing a hologram recording material having the aforementioned constitution, wherein the metal complex catalyst comprising a rare earth metal as an active center is a metal complex compound represented by the following formula (2):

$$(Cp1)(cp2)Mr-(R)p\cdot(L)q \quad (2)$$

wherein Cp1 and Cp2 each independently represent an unsubstituted cyclopentadienyl or a substituted cyclopentadienyl, and Cp1 and Cp2 may be connected to each other directly or through a connecting group;

Mr represents a rare earth metal having a valency of r which is an integer of from 2 to 4;

R represents a hydrogen atom or a straight-chain alkyl group having 1 to 3 carbon atoms;

L represents a solvent having coordinatability; and p and q each represent the number of R's and L's, wherein each of p and q are an integer of from 0 to 2 and are predetermined with respect to r such that the equation r=p+2 is satisfied.

EFFECT OF THE INVENTION

Thus, according to the present invention, a specific photopolymerization initiation source is added to a specific polymer having a radically polymerizable side chain vinyl group in the molecule thereof to form a refractive index modulation polymer composition having a high sensitivity over a wide wavelength range, a high chemical stability and an excellent operability, making it possible to provide a transparent hologram recording material which can efficiently modulate (change) the refractive index by visible light laser and is also excellent in transparency after this modulation, i.e., high diffraction efficiency with visible laser, without requiring any conventional complicated procedure.

BEST MODE FOR CARRYING OUT THE INVENTION

Figure 1:
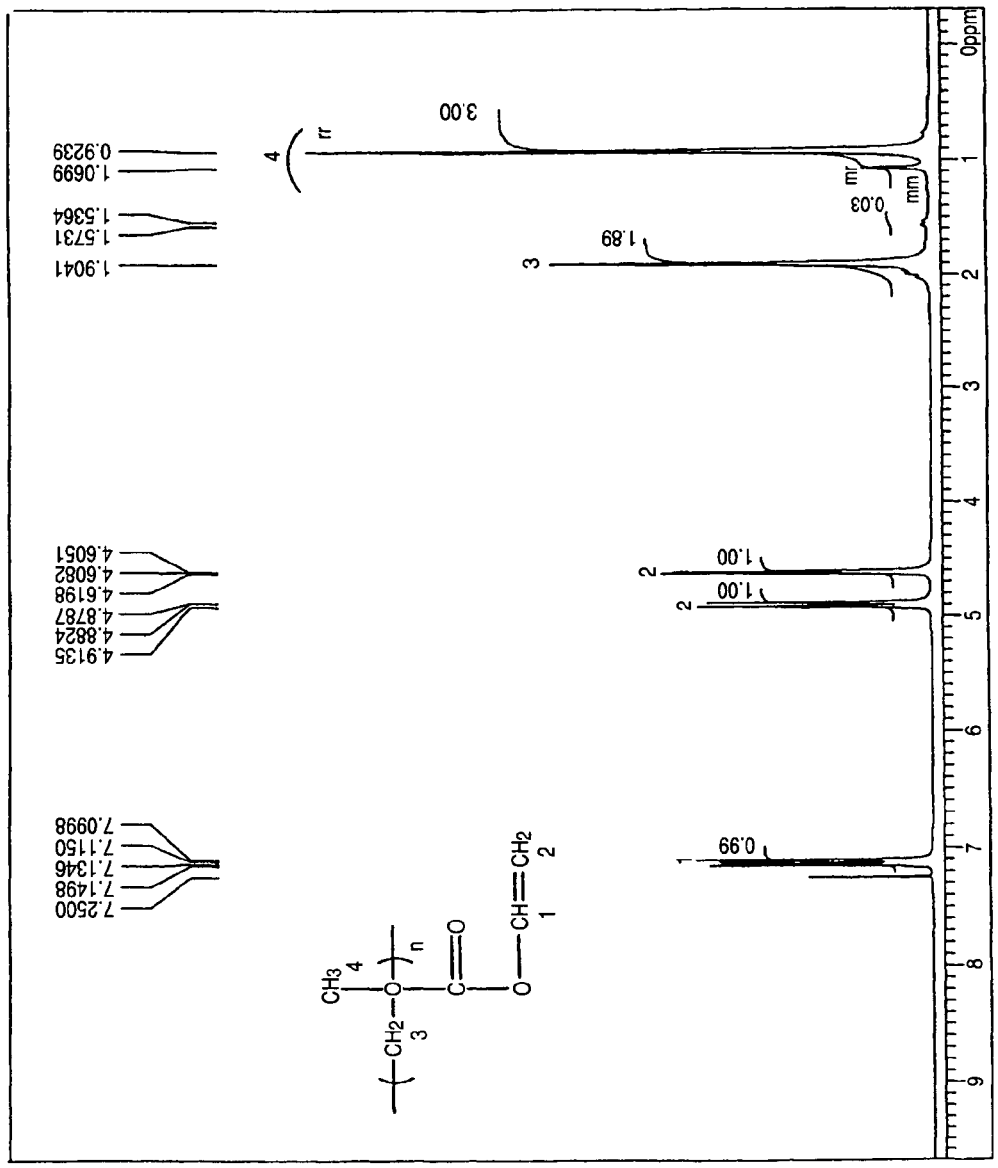
FIG. 1 is a characteristic diagram illustrating 1H-NMR chart of the polymer (A) (polyvinyl methacrylate: PVMA) obtained in Example 1.

The essence of the hologram recording material of the present invention is that, when irradiated with visible light having a wavelength range as wide as 400 nm to 800 nm, the aforementioned side chain vinyl group in the polymer (A) having a radically polymerizable side chain vinyl group in the molecule thereof undergoes polymerization reaction in the presence of a photopolymerization initiator constituting the photopolymerization initiation source (B) or a radical polymerization initiation source produced from the photopolymerization initiator and a visible light-sensitizing dye to cause density change by which the refractive index is modulated (increased).

As the aforementioned polymer (A), a polyvinyl methacrylate (hereinafter referred to as "PVMA") is preferably used. Among optical polymers, PVMA has an excellent transparency, can difficulty undergo birefringence and exhibits a good formability, a balanced mechanical strength and the greatest refractive index difference obtained by irradiation with visible light, and therefore, it is particularly preferred in the present invention.

Also, in the present invention, a polymer having a radically polymerizable side chain vinyl group in the molecule thereof such as copolymer comprising PVMA as constituent as the aforementioned polymer (A) can be copolymerized with a copolymerizable monomer at an arbitrary composition ratio to obtain a great refractive index increase with a lower irradiance in comparison with the case of homopolymers such as PVMA.

In the present invention, a hologram recording material in which the photopolymerization initiation source (B) which generates an active seed by visible light is incorporated in the aforementioned polymer (A) is irradiated with visible light laser and the wavelength of this laser can be predetermined without any specific limitation so far as the aforementioned polymer (A) can be changed in its structure and enhanced in its density change. Although it is not unequivocally determined due to the relationship with radiation intensity, etc., it is preferably from 400 nm to 800 nm, particularly from 400 nm to 650 nm.

The light source of the visible light laser is arbitrarily selected taking into account the wavelength of radiation. Specifically, Kr (wavelength: 647 nm, 413 nm, 407 nm), He—Ne (wavelength: 633 nm), Ar (wavelength: 514.5 nm, 488 nm), YAG (wavelength: 532 nm), He—Cd (wavelength: 442 nm), and the like may be exemplified. Further, in order to effect irradiation, a wavelength filter may be used to irradiate with light having a specific wavelength.

When the radiation intensity of the visible light laser is too small, the photochemical reaction of the polymer (A) having a radically polymerizable side chain vinyl group in the molecule thereof cannot be induced, and therefore, it is not appropriate since it is impossible to achieve the change of refractive index. When the radiation intensity of the visible light laser is too large, the formed material may become opaque or exhibit a deteriorated strength. Accordingly, the radiation intensity is thus properly predetermined taking into account them.

Specifically, although depending on the wavelength of radiation, it is preferably predetermined to be from about 0.001 to 3 W/cm$^2$, particularly preferably from 0.1 to 1 W/cm$^2$.

The period of time for the irradiation of the visible light laser is arbitrarily predetermined taking into account the refractive index difference to be obtained. In other words, in accordance with the refractive index modulation polymer composition of the present invention, the refractive index of the molded material increases continuously upon irradiation with visible light laser and thus can be arbitrarily controlled by predetermining the radiation time to a proper value.

Although the detailed radiation time differs with the radiation wavelength and strength of the visible light laser, the radiation time during which a molded PVMA, for example, is irradiated with YAG laser including 532 nm at a dose of 300 mW/cm$^2$ to increase the refractive index by about 0.005 is preferably from about 0.5 to 2 minutes.

Further, in order to irradiate the molded material with visible light laser, the temperature of the molded material may be raised. Accordingly, the reactivity of the polymer (A) having a radically polymerizable side chain vinyl group in its molecule can be enhanced, making it possible to efficiently change the refractive index.

Although the detailed temperature can be properly predetermined so far as it does not go beyond the melting temperature of the molded material, the temperature of a molded material made of PVMA, for example, is preferably from about 40° C. to 80° C.

When the molded material is irradiated with visible light laser under these conditions, the side chain vinyl group in the polymer (A) undergoes crosslinking that raises the density and hence the refractive index of the molded material. As the crosslinking reaction, there can be effectively used any reaction that allows the rise of density involving the crosslinking of a part of the molded material, etc.

In the present invention, when the aforementioned irradiation with light is effected, a refractive index rise of 0.01 or more can be obtained at maximum. In actuality, when a refractive index difference of 0.005 or more can be obtained, it is a value sufficiently high for optical devices such as optical fiber and light diffraction lattice.

The polymer (A) is a polymer having a radically polymerizable side chain vinyl group in the molecule thereof, which is a polymer of monomers comprising as an essential component an acryl-vinyl monomer represented by the following formula (1):

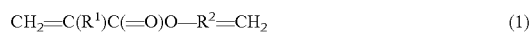

wherein R$^1$ represents a hydrogen atom or methyl group; and R$^2$ represents a saturated or unsaturated hydrocarbon group having 1 to 20 carbon atoms, which may contain hetero atoms or halogen atoms in the molecule thereof.

The acryl-vinyl monomer represented by the aforementioned formula (1) is not specifically limited. Examples thereof include vinyl methacrylate, vinylethyl methacrylate, vinyloctyl methacrylate, vinylhexyl methacrylate, vinylbutyl methacrylate, vinyl acrylate and vinylethyl acrylate, but the examples are not limited thereto. From the standpoint of general-purpose properties and availability, it is particularly desired to use vinyl methacrylate.

The polymer (A) of the present invention is not merely a homopolymer of acryl-vinyl monomer such as PVMA, and it can be a copolymer of acryl-vinyl monomer represented by the formula (1) with other monomers to enhance its heat resistance and compatibility with thermosetting resin.

Such a copolymer may be, for example, a block copolymer with the arrangement of copolymerization of acryl-vinyl monomer A represented by the formula (1) with other monomer B of which is a block chain such as AAAAAA-BBBBBB or a random copolymer with the arrangement of such copolymerization of which is a random chain such as ABAABA-BABBA.

The aforementioned copolymer is preferably a random copolymer in order to obtain a great refractive index change with a low irradiance intensity of visible laser. Even a block copolymer can be properly used taking into account the rise of refractive index and the desired physical properties.

When the copolymer (A) is thus in the form of a copolymer of acryl-vinyl monomer represented by the formula (1) with other monomer, the kind of the polymer material can be optimized from the standpoint of film properties, transparency, production cost, etc. of the formed material, and particularly when the copolymer (A) is a random copolymer, the initial reactivity of the side chain vinyl group can be enhanced and there are thus present combinations allowing the rise of refractive index with a lower amount of light.

As the other monomer to be used for such a purpose, there may be used any monomer which can be copolymerized with acryl-vinyl monomer and are inert to or do not deactivate anionic polymerization catalysts. From the standpoint of copolymerizability, (meth)acrylates are preferred.

Specific examples of thereof include methyl methacrylate and ethyl methacrylate. Further, monomers containing halogen atom such as trifluoroethyl methacrylate or monomers containing hetero atom such as diethyl aminoethyl methacrylate may be used.

Further, monomers having a functional group that deactivates catalyst can be used when the functional group is capped. For example, hydroxyethyl methacrylates or the like can be used when the hydroxyl group is previously capped with a trimethylsilyl group or the like. Similarly, (meth) acrylic acids having a carboxyl group can be used.

The ratio of the acryl-vinyl monomer represented by the formula (1) to the aforementioned other monomer used in such a copolymer is not specifically limited so far as the desired change of refractive index can be obtained from before to after the irradiation with visible light. In general, when the other monomer which is the latter accounts for from 10 to 80 mol %, particularly from 10 to 50 mol % of the total amount of the monomers, the merits of copolymerization can be attained without deteriorating the reactivity of the side chain vinyl group in the former monomer.

Thus, the copolymer (A) to be used in the present invention can undergo a desired change of refractive index from before to after the irradiation with visible light by the reactivity of the side chain vinyl group when it contains the acryl-vinyl monomer represented by the formula (1) in a proportion of 20 mol % or more based on the total amount of the monomers. When the polymer (A) is a copolymer, the proportion of the other monomer may be predetermined to be from 10 to 80 mol % based on the total amount of the monomers.

In the present invention, the aforementioned polymer (A) can be obtained by subjecting the acryl-vinyl group represented by the aforementioned formula (1), singly or in admixture with other monomer, to polymerization reaction in the presence of a specific anionic initiator as a polymerization catalyst.

When a radical initiator is used, the side chain vinyl group is also consumed during the polymerization and the side chain vinyl group to be used in the change of refractive index cannot be left, and a network polymer (gel) insoluble in the solvent is produced. Moreover, a general-purpose anionic initiator such as BuLi which is an organic metal compound and Grignard reagent is not preferable, since some of the side vinyl groups undergo crosslinking reaction during the polymerization and the yield and molecular weight of the polymer thus obtained are reduced.

Therefore, in the present invention, as the anionic initiator for obtaining the aforementioned polymer, a metal complex catalyst comprising a rare earth metal as an active center is used.

Herein, the rare earth metal indicates a metal of the group XIII such as Sc, Y, lanthanoid and actinoid, and the active center indicates a site where the catalyst is oriented in or bonded to a monomer to initiate direct polymerization reaction. Such a metal complex catalyst is so-called metalocene catalyst, and the examples thereof include complex of cyclopentadienyl with metal ion, complex of indenyl with metal ion, and complex of fluorenyl with metal ion.

Among these metal complex catalysts, the complex of cyclopentadienyl with metal ion, particularly a metal complex compound represented by the following formula (2) is preferably used.

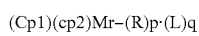  (2)

In the formula (2), Cp1 and Cp2 each independently represent an unsubstituted cyclopentadienyl or a substituted cyclopentadienyl, and Cp1 and Cp2 may be connected to each other directly or through a connecting group; Mr represents a rare earth metal having a valency of r which is an integer of from 2 to 4; R represents a hydrogen atom or a straight-chain alkyl group having 1 to 3 carbon atoms; L represents a solvent having coordinatability; and p and q each represent the number of R's and L's, wherein each of p and q are an integer of from 0 to 2 and are predetermined with respect to r such that the equation r=p+2 is satisfied.

In the aforementioned formula (2), when Cp1 or Cp2 is a substituted cyclopentadienyl, the substituent is preferably a methyl group or trimethylsilyl group. The number of substituents in Cp1 or Cp2 is preferably from 3 to 5.

Examples of Cp1 or Cp2 include $C_5H_5$, $C_5(CH_3)_5$, $C_5H_2(CH_3)_3$, $C_5(CH_2CH_3)_5$, $C_5H_2(CH_2CH_3)_3$, $C_5H_2[CH(CH_3)_2]_3$, $C_5H_2[Si(CH_3)_3]_3$, and $C_5H_2[CH(CH_3)_2]_3$.

Cp1 and Cp2 may be connected to each other directly or through a connecting group, particularly preferably through a connecting group.

The connecting group is preferably —$(CH_2)n[Si(CH_3)_2]$m- in which n and m each represent an integer of from 0 to 3 and (m+n) is from 1 to 3, particularly preferably a dimethylsilyl group (in which n is 0 and m is 1) or a dimethylene group (in which n is 2 and m is o). Alternatively, the connecting group may be a group containing a hetero atom such as etheric oxygen atom.

Further, in the aforementioned formula (2), M represents a rare earth metal atom having a valency of r, which is an active center, and is preferably yttrium (Y), ytterbium (Yb), samarium (Sm) or ruthenium (Lu). The valency (r) is 2, 3 or 4, particularly preferably 2 or 3.

R represents a hydrogen or a straight-chain alkyl group having 1 to 3 carbon atoms, preferably a methyl group. L represents a solvent having coordinatability, preferably a solvent containing hetero atoms, more preferably an ether-based solvent. The ether-based solvent is preferably a cyclic ether-based solvent such as tetrahydrofurane and tetrahydropyrane, diethyl ether, t-butyl methyl ether or the like.

Among the metal complex compounds represented by the aforementioned formula (2), metal complex compounds represented by the following formulae (3) to (5) are particularly preferably used.

(3)

(4)

(5)

(In these formulae, Cp* represents 1,2,3,4,5-pentamethylcyclopentadienyl and THF represents tetrahydrofurane.)

In the present invention, the aforementioned metal complex catalyst comprising a rare earth metal as an active center to be used as an anionic initiator is preferably used in an amount of from 0.01 to 10 mol %, more preferably from 0.1 to 5 mol % based on the amount of the acryl-vinyl monomer represented by the formula (1), singly or in admixture with other monomer.

When the amount of the aforementioned metal complex catalyst to be used is too small, it is difficult to proceed with anionic polymerization, and when the amount of the aforementioned metal complex catalyst to be used is too large, the properties such as molecular weight and molecular weight distribution can be easily impaired.

The anionic polymerization is preferably conducted under anhydrous and oxygen-free conditions, and is also preferably conducted in an inert gas atmosphere such as nitrogen and argon. Further, the anionic polymerization is preferably conducted in the presence of a solvent. The solvent is preferably a nonpolar solvent, particularly preferably an aromatic nonpolar solvent such as benzene, toluene and xylene.

The amount of the monomer during the polymerization is preferably from 5 to 30% by weight in the solvent. When the amount of the monomer falls below 5% by weight, it is likely that the molecular weight of the polymer cannot be sufficiently raised, and when the amount of the monomer exceeds 30% by weight, the viscosity of the system rises during the polymerization, possibly causing the deterioration of the inversion rate of polymerization.

The reaction temperature during the polymerization is preferably 100° C. or less, particularly preferably from about from −95° C. to +30° C., and more preferably, from −95° C. to −25° C. There is a tendency that the lower the temperature at which the polymerization reaction is effected is, the greater the stereoregularity and hence syndiotacticity of the polymer thus produced are.

The polymer (A) thus obtained has unreacted radically polymerizable side chain vinyl groups left in the polymer molecules, and the residual ratio of unreacted radically polymerizable side chain vinyl groups is preferably 90% or more, more preferably 95% or more.

Herein, the residual ratio of unreacted radically polymerizable side chain vinyl groups can be determined by, e.g., 1H-NMR. In the case of PVMA, for example, it can be calculated from the area ratio of the peak assigned to proton derived from vinyl group (in the vicinity of 4.9 ppm) to the peak assigned to proton derived from α-position methyl group (0.6 to 1.3 ppm).

Further, the polymer (A) of the present invention obtained by the aforementioned anionic polymerization method preferably has a stereoregularity of 70% or more in terms of syndiotacticity (rr) by selecting monomers. Accordingly, the polymer (A) has a far higher glass transition point (Tg) and hence an excellent heat resistance.

In other words, a polymer obtained by the copolymerization in the presence of a metal metalocene complex catalyst comprising a rare earth metal as an active center, i.e., polymer (A) having a radically polymerizable side chain vinyl group in the molecule thereof has a syndiotacticity (rr) of 70% or more.

In general, syndiotacticity is explained as follows.

When two different atoms or atomic groups (substituents) are bonded to a carbon atom in the repeating units constituting the main chain of a chain-like polymer molecule, stereoisomerism occurs with this carbon atom as center. In this case, the steric configuration in which arbitrary repeating units adjacent to each other along the main chain are always arranged reversed to each other is called syndiotactic; the steric configuration in which arbitrary repeating units adjacent to each other along the main chain are always arranged similarly to each other is called isotactic; and the steric configuration in which arbitrary repeating units adjacent to each other along the main chain are arranged random to each other is called atactic. The proportions of syndiotactic portions, isotactic portions and atactic portions in all the steric configuration in the polymer chain are called syndiotacticity, isotacticity and atacticity, respectively.

Syndiotacticity is an index representing the stereoregularity of a polymer.

The value of syndiotacticity in the present invention is the molar percentage of syndiotactic triad polymer units in the total amount of polymer units derived from the monomers constituting a polymer. In the present specification, triad indicates a chain composed of three repeating units in a polymer. Supposing that one of the steric configuration of α-carbons (asymmetric carbons) in the carbonyl group of the three repeating units is represented by d and the other is represented by l, the ddd chain or lll chain is called isotactic triad, dld chain or ldl chain is called syndiotactic triad and ddl chain, lld chain, dll chain or ldd chain is called heterotactic triad.

Syndiotacticity is determined by nuclear magnetic resonance spectrum (NMR). Namely, syndiotacticity can be calculated by dissolving the polymer (A) of the present invention in a deueterated solvent capable of dissolving the polymer (A) or allowing the polymer (A) to swell with deueterated solvent, subjecting it to measurement by 1H-NMR method or 13C-NMR method, measuring the integration of signals reflecting syndiotacticity, isotacticity and atacticity, and then determining the ratio of these integrations.

In the case where the polymer of the invention is difficulty dissolved in the deueterated solvent, a deueterated solvent or undeueterated solvent may be added to the polymer before use according to the necessity. In the case where undeueterated solvent is used, a solvent containing atoms having no effects on the measurement of NMR is preferably selected, and examples thereof include dichloroform and dibenzene, which have no effects on 1H-NMR spectral data.

The selection of nucleus to be measured in NMR can be properly changed depending on the spectral pattern of the polymer. Basically, it preferably depends on 1H-NMR spectrum, and in the case where the peak required in 1H-NMR data is superposed on other unnecessary peaks or cannot be measured by 1H-NMR, it preferably depends on 13C-NMR spectrum.

Specifically, in the case where the substituent X bonded to α-carbon in the carbonyl group of vinyl (meth)acrylate monomer is a hydrogen atom or methyl group, the ratio (rr/mr/mm) of syndiotactic triad (rr), atactic (or heterotactic) triad (mr) and isotactic triad (mm) can be determined by determining the area ratio of signals of 1H-NMR derived from X making the use of the fact that these signals have chemical shifts which are different among hydrogen atom in syndiotactic triad, hydrogen atom in isotactic triad and hydrogen atom in atactic triad.

For reference to the assignment in NMR spectrum, Shinban Koubunshi Bunseki Handobukku (New Edition of Polymer Analysis Handbook), compiled by The Japan Society for Analytical Chemistry (1995), and Mackromol. Chem., Rapid. Commun., 14, 719 (1993) were used.

Further, syndiotacticity in the case where the substituent bonded to α-carbon in the carbonyl group of vinyl (meth) acrylate monomer is a fluorine atom or trifluoromethyl group can be determined by the area ratio of 13C-NMR peaks.

In other words, (rr/mr/mm) can be determined by determining the area ratio of these peaks making the use of the fact that 13C-NMR signals of α-carbon in the carbonyl group are different among carbon atom in syndiotactic triad, carbon atom in isotactic triad and carbon atom in atactic triad.

The syndiotacticity in the present invention is a value calculated as [rr/(rr+mr+mm)]×100(%) from the various tacticity thus determined. The polymer (A) obtained by the production method of the present invention has a syndiotacticity (rr) of 50% or more as thus determined, and particularly when the syndiotacticity is as high as 70% or more, the polymer (A) is excellent in heat resistance and strength as compared with atactic polymers. The higher the syndiotacticity is, the better these physical properties are.

As above, the polymer (A) of the present invention has excellent physical properties in terms of heat resistance and strength as compared with the conventional polymers. This polymer (A) preferably has a weight-average molecular weight of 1,000 or more, more preferably 2,000 or more from the standpoint of strength and physical properties. On the other hand, it is preferable the weight-average molecular weight of the polymer (A) is 80,000 or less, preferably 70,000 or less, particularly preferably 50,000 or less, since the reactivity of the side chain vinyl group can be raised, making it possible to cause the change of refractive index with a small exposure. For the weight-average molecular weight, values in standard polystyrene equivalence measured by GPC method are used.

Next, the photopolymerization initiation source (B) to be used in the present invention generates active seeds with the irradiation with visible light, and for more detail, it generates active seeds (radical, cation, anion, etc.) when it absorbs visible light (400 to 800 nm).

The kind of the photopolymerization initiation source (B) is not specifically limited so far as it has such properties. Typically, there is exemplified a photopolymerization initiator which absorbs visible light to generate active seeds or a mixture of a visible light-sensitized dye which absorbs visible light and a photopolymerization initiator (In this case, the photopolymerization initiator may be a photopolymerization initiator which absorbs visible light or a photopolymerization initiator which does not absorb visible light). In the latter case, the reaction of movement of energy or electron from the visible light-sensitized dye which has absorbed visible light or near infrared energy occurs so that the photopolymerization initiator is decomposed to generate active seeds.

Among the photopolymerization initiators, examples of the photopolymerization initiator which absorbs visible light to generate active seeds include bis($\eta^5$-2,4-cyclopentadiene-1-yl)-bis[2,6-difluoro-3-(1H-pyrrole-1-yl)-phenyl]titanium ("Irgacure 784", produced by Nihon Ciba Geigy K.K.) and phenylbis(2,4,6-trimethylbenzoyl)phosphine oxide ("Irgacure 819", produced by Nihon Ciba Geigy K.K.).

Further, among the photopolymerization initiators, examples of the photopolymerization initiator which does not absorb visible light include bisimidazole compounds, 2,4,6-substituted-1,3,5-triazine compounds, onium salt compounds, metal-allene complexes, benzoin ether compounds, ketal compounds, acetophenone compounds, benzophenone compounds, thioxanthone compounds, peroxides, N-arylglycine compounds, and anthraquinone compounds.

As bisimidazole compound, specific examples thereof include 2,2'-bis(o-chlorophenyl)-4,4',5,5'-tetraphenyl-1,1'-biimidazole and 2,2'-bis(o-chlorophenyl)-4,4',5,5'-tetrakis(2,3-dimethoxyphenyl)-1,1'-biimidazole.

As 2,4,6-substituted-1,3,5-triazine compound, specific examples thereof include 2,4,6-tris(trichloromethyl)-1,3,5-triazine, 2-methyl-4,6-bis(trichloromethyl)-1,3,5-triazine, 2-phenyl-4,6-bis(trichloromethyl)-1,3,5-triazine, 2,4-bis(trichloromethyl)-6-(p-methoxyphenyl vinyl)1,3,5-triazine and 2-(4'-methoxy-1'-naphthyl)-4,6-bis(trichloromethyl)-1,3,5-triazine.

As onium salt compound, specific examples thereof include diaryl iodonium salts and triaryl sulfonium salts in which diphenyl iodonium, 4,4'-dicyclodiphenyl iodonium, 4,4'-dimethoxydiphenyl iodonium, 4,4'-di-t-butyl diphenyl iodonium, 4-methyl-4'-isopropyldiphenyl iodonium, 3,3'-dinitrodiphenyl iodonium, and the like are combined with chloride, bromide, tetrafluoroborate, hexafluorophosphate, hexafluoroarsenate, hexafluoroantimonate, tetrakis(pentafluorophenyl) borate or trifluoromethanesulfonic acid.

As metal-allene complexes, examples thereof include titanocene and ferrocene. As benzoin ether compounds, example thereof include benzyl, benzoin, benzoinalkyl ether and 1-hydroxycyclohexylphenylketone.

As ketal compounds, examples thereof include benzylalkyl ketal.

As acetophenone compounds, examples thereof include 2,2'-dialkoxyacetophenone, 2-hydroxy-2-methyl propiophenone, p-t-butyltrichloroacetophenone and p-t-butylcycloacetophenone.

As benzophenone compounds, examples thereof include benzophenone, 4-chlorobenzophenone, 4,4'-dichloro benzophenone, methyl o-benzoylbenzoate, 3,3'-dimethyl-4-methoxybenzophenone, 4-benzoyl-4'-methyldiphenyl sulfide and dibenzosuberone.

As thioxanthone compounds, examples thereof include thioxanthone, 2-chlorothioxanthone, 2-alkylthioxanthone and 2,4-dialkylthioxanthone.

As peroxides, examples thereof include-3,3',4,4'-tetra(t-butylperoxycarbonyl)benzophenone, etc.

As N-arylglycine compounds, examples thereof include N-phenylglycine, N-(p-chlorophenyl)glycine, N-hydroxyethyl-N-phenylglycine and N-(2-hydroxy-3-methacryloxypropyl)-N-phenylglycine.

As the visible light-sensitized dye, there may be used a dye capable of absorbing visible light or near infrared energy, such as azo dye, anthraquinone dye, benzoquinone dye, naphthoquinone dye, diarylmethane dye, triarylmethane dye, cyanine dye, melocyanine dye, fluorane-based dye, squarilium-based dye, chloconium-based dye, pyrilium-based dye, thiopyrilium-based dye, phthalocyanine derivative, naphthalocyanine derivative, indigo-based dye, coumarine dye, ketocoumarine-based dye, quinacridone-based dye, quinophthalone-based dye, pyrrolopyrrole-based dye, benzodifuranone-based dye, acridine dye, oxazine dye, thiazine dye, xanthene-based dye, thioxanthene-based dye, styryl-based dye, spiropyrane-based dye, spirooxazine-based dye and organic ruthenium complex.

Further, as the visible light-sensitized dye, there may be used dyes described in known publications: Makoto Okawara et al, "Kinousei Shikiso (Functional Dyes)", Kodansha Scientific, 1992, Ken Matsuoka, "Shikso no Kagaku to Ouyou (Chemistry and Application of Dyes)", Dainippon Tosho, 1994, Makoto Okawara et al, "Shikiso Handobukku (Handbook of Dyes)", Kodansha, 1986, etc., besides the aforementioned dyes.

In the present invention, as the visible light-sensitized dyes to be used in combination with the photopolymerization initiator, there may be used the aforementioned various dyes, singly or in arbitrary combination of two or more thereof, such that light having corresponding wavelength can be absorbed.

In the present invention, the amount of the photopolymerization initiation source (B) having the aforementioned constitution to be used is not specifically limited, but the photopolymerization initiator, if any, is normally used in an amount of from about 0.1 to 50% by weight, preferably from about 2.0 to 20% by weight based on the total weight of the hologram recording material composed of an optical refractive index-modulated polymer composition containing the polymer (A).

Further, the visible light-sensitized dye is used in an amount of from about 0.1 to 10% by weight, preferably from about 0.2 to 5% by weight based on the total weight of the hologram recording material composed of an optical refractive index-modulated polymer composition containing the polymer (A).

The hologram recording material of the present invention may further comprise a monomer (C) containing an ethylenically unsaturated bond incorporated therein in addition to the aforementioned polymer (A) and photopolymerization initiation source (B) which generates active seeds by visible light. The incorporation of the monomer (C) containing an ethylenically unsaturated bond makes it possible to cause the change of refractive index with a small exposure.

The monomer (C) containing an ethylenically unsaturated bond to be used in the present invention is not specifically limited so far as it is a monomer having an ethylenically unsaturated bond in the molecule thereof, but a (meth)acrylic monomer or styrene-based monomer having a high radical-polymerizability can be properly used. Further, a monofunctional monomer having only one unsaturated bond per molecule or a polyfunctional monomer having a plurality of unsaturated bonds may be used. Moreover, the molecular weight of the monomer is not specifically limited and oligomers having molecular weight of several thousands may also be used.

Examples of such a monomer, as (meth)acrylic monomer, include tetrahydrofurfuryl (meth)acrylate, hydroxyethyl (meth)acrylate, (meth)acryloyloxyethyl succinate, (meth)acryloyloxyethyl phthalate, isobornyl (meth)acrylate, cyclohexyl (meth)acrylate, dicyclopentanyl (meth)acrylate, dicyclopentenyl (meth)acrylate and (meth)acrylate having phosphazene skeleton.

Further, as polyfunctional monomer or oligomer, examples thereof include bifunctional monomers such as polyethylene di(meth)acrylate, polypropylene glycol di(meth)acrylate, neopentyl glycol di(meth)acrylate and 1,6-hexanediol di(meth)acrylate; trifunctional monomers such as trimethylolpropane tri(meth)acrylate, pentaerythritol tri(meth)acrylate and aliphatic tri(meth)acrylate; tetrafunctional monomers such as pentaerythritol tetra(meth)acrylate, di(trimethylolpropane) tetra(meth)acrylate and aliphatic tetra(meth)acrylate; and pentafunctional or higher monomers such as dipentaerythritol penta (meth)acrylate and dipentaerythritol hexa(meth)acrylate.

Moreover, as other monomers, examples thereof include vinyl compounds such as styrene, vinyl toluene, chlorostyrene, bromostyrene, divinyl benzene, 1-vinylene naphthalene, 2-vinylnaphthalene and N-vinylpyrrolidone; and allyl compounds such as diethylene glycol bisallyl carbonate, trimethylolpropane diallyl, diallyl phthalate, dimethacryl phthalate and diallyl isophthalate.

In particular, in the present invention, the monomer (C) containing an ethylenically unsaturated bond preferably has a refractive index which is different from that of the polymer (A) by 0.005 or more. As such a monomer (C), p-bromostyrene (refractive index: 1.59), 9,9-bis[4-(2-acryloxyethoxy)phenyl]fluorene (refractive index: 1.62) or the like may be used in the case that the polymer (A) is a polyvinyl methacrylate (refractive index: 1.49).

Herein, the refractive index of the polymer (A) can be measured by m-line method (prism coupling method) using a He—Ne laser (wavelength: 644 nm) in TE (transverse electric) mode (mode of polarization of light parallel to the film surface of the material) and TM (transverse magnetic) mode (mode of polarization of light perpendicular to the film surface of the material). Further, the refractive index of a monomer can be measured using an Abbe refractometer.

Although the reason why the incorporation of the monomer (C) containing an ethylenically unsaturated bond thus makes it possible to cause the change of refractive index with a small exposure is not definite, it is thought because the monomer itself has a low viscosity and a high fluidity and hence a high polymerization reactivity and thus can reduce the response time (exposure time). Further, it is thought that the incorporation of the monomer having a refractive index which is different from that of the polymer (A) by 0.005 or more makes it possible to enhance the refractive index and obtain a diffraction efficiency on a predetermined level in a short period of time.

The amount of such a monomer (C) containing an ethylenically unsaturated bond to be incorporated is from 0.1 to 50 parts by weight, preferably from 0.5 to 20 parts by weight based on 100 parts by weight of the polymer (A). When the amount is smaller than 0.1 parts by weight, it is difficult to obtain the effect of reducing the exposure time, and when the amount exceeds 50 parts by weight, the deterioration of diffraction efficiency or strength may occur.

The hologram recording material of the present invention may further comprise a plasticizer and/or a chain transfer agent incorporated therein in addition to the aforementioned polymer (A) and photopolymerization initiation source (B) which generates active seeds by visible light, optionally with the monomer (C) containing an ethylenically unsaturated bond according to the necessity. The incorporation thereof makes it possible to enhance the crosslinking reactivity of the side chain vinyl group and cause the change (increase) of refractive index more fairly.

Examples of the plasticizer include triethylene glycol, triethylene glycol diacetate, triethylene glycol dipropionate, triethylene glycol dicaprylate, triethylene glycol dimethyl ether, triethylene glycol bis(2-ethylhexanoate), tetraethylene glycol diheptanoate, poly(ethyleneglycol), poly(ethylene glycol)methyl ether, isopropyl naphthalene, diisopropyl naphthalene, poly(propyleneglycol), triglyceryl butyrate, diethyl adipate, diethyl-sebacate, dibutyl suberate, tributyl phosphate and tris(2-ethylhexyl) phosphate.

As the chain transfer agent, a chain transfer agent which is known to be effective upon using in combination with a photopolymerization initiator to constitute a photosetting system (described in, e.g., U.S. Pat. No. 3,652,275) is preferably used.

Specific examples of the chain transfer agent include trimethylolpropane tris-3-mercaptopropionate, N-phenylglycine, 1,1-dimethyl-3,5-diketocyclohexene, 2-mercaptobenzothiazole, 2-mercaptobenzoxazole, 2-mercaptobenzimidazole, pentaerythritol tetrakis (mercaptoacetate), 4-acetamidethiophenol, mercaptosuccinic acid, dodecanethiol, β-mercapto ethanol, 2-mercaptoethanesulfonic acid, 1-phenyl-4H-tetrazole-5-thiol, 6-mercaptopurine monohydrate, bis-(5-mercapto-1,3,4-thiodiazole-2-yl) and 2-mercapto-5-nitrobenzimidazole, 2-mercapto-4-sulfo-6-chlorobenzoxazole.

Among these, 2-mercaptobenzoxazole (2-MBO), 2-mercapto benzimidazole (2-MBI), 2-mercaptobenzothiazole (2-MBT), trimethylolpropane tris-3-mercaptopropionate, and the like are particularly preferable from the standpoint of compatibility with polymer, reaction acceleration and general purpose properties.

In the present invention, the aforementioned plasticizer is normally used in an amount of from about 2 to 25% by weight, preferably from 5 to 15% by weight based on the total weight of the hologram recording material composed of an optical refractive index-modulated polymer composition containing the polymer (A) and photopolymerization initiator (B).

Similarly, the aforementioned chain transfer agent is normally used in an amount of from about 2 to 25% by weight, preferably from about 5 to 15% by weight based on the total weight of the hologram recording material composed of an optical refractive index-modulated polymer composition containing the polymer (A) and photopolymerization initiator (B).

Hologram recording materials comprising PVMA, i.e., homopolymer of vinyl methacrylate as polymer (A) (Examples 1 to 10) will be described in more detail as examples of the present invention. Further, for comparison, hologram recording materials comprising a polymethyl methacrylate or polystyrene as polymer (Comparative Examples 1 and 2) will be also described.

Example 1

Synthesis of Catalyst

A coordinate anionic polymerization catalyst was synthesized as follows.

Into a 1 L flask subjected to argon replacement were charged 3.9616 g of SmI$_2$ and 330 ml of tetrahydrofurane to which 45.858 g of pentamethyl cyclopentadienyl potassium salt [(C$_5$Me$_5$)K] was added with stirring. The mixture was reacted at room temperature. Thereafter, THF was removed under reduced pressure. To the solid material, toluene was then added. The supernatant liquid was recovered, dried under reduced pressure, and then processed with THF and hexane to recrystallize [(C$_5$Me$_5$)$_2$Sm(THF)$_2$]. In 60 ml of toluene, 2.5 g of the [(C$_5$Me$_5$)$_2$Sm(THF)$_2$] was dissolved. To the solution was then added 2.2 ml of triethyl aluminum. The mixture was reacted with stirring. The precipitate was then removed. Recrystallization was then effected to obtain (C$_5$Me$_5$)$_2$SmMe(THF).

Synthesis of PVMA

Into a Schlenk tube in which the water content and air within had been thoroughly removed were charged 80 ml of sufficiently dried and deaerated toluene, which was then dried over CaH$_2$. To the toluene was then added 20 ml (18.7 g/166.4 mmol) of vinyl methacrylate which had been purified by distillation. The internal temperature was then adjusted to −78° C. Then, a material obtained by diluting 0.189 g (0.373 mmol) of (C$_5$Me$_5$)$_2$SmMe(THF) which is a catalyst synthesized by the aforementioned method with 5 ml of dried toluene was charged to initiate polymerization. The amount of the catalyst was adjusted such that the ratio of monomer to catalyst was 446. The reaction was conducted at a polymerization temperature of −78° C. for 3 hours. To the reaction system was then added methanol to suspend the polymerization reaction. Methanol was further added to cause the resulting polymer (polyvinyl methacrylate) to be precipitated and isolated. The polymer was dissolved in ethyl acetate, and then recrystallized from methanol so that it was purified.

The drying of the polymer was effected under reduced pressure. The amount of the polymer thus produced was 18.7 g (yield>99% by weight). Further, the number-average molecular weight (Mn), weight-average molecular weight (Mw) and molecular weight distribution (Mw/Mn) of the polymer as determined by GPC (gel permeation chromatography) were 77,000, 115,000 and 1.49, respectively.

Moreover, the residual ratio of radically polymerizable side chain vinyl group in the polymer determined by 1H-NMR was 100% and the stereoregularity of the main chain was 92% as calculated in terms of syndiotacticity (rr).

residual ratio of vinyl group (%)=vinyl group (4.9 ppm)/ methyl group (0.6 to 1.3 ppm)×100

Figure 2:
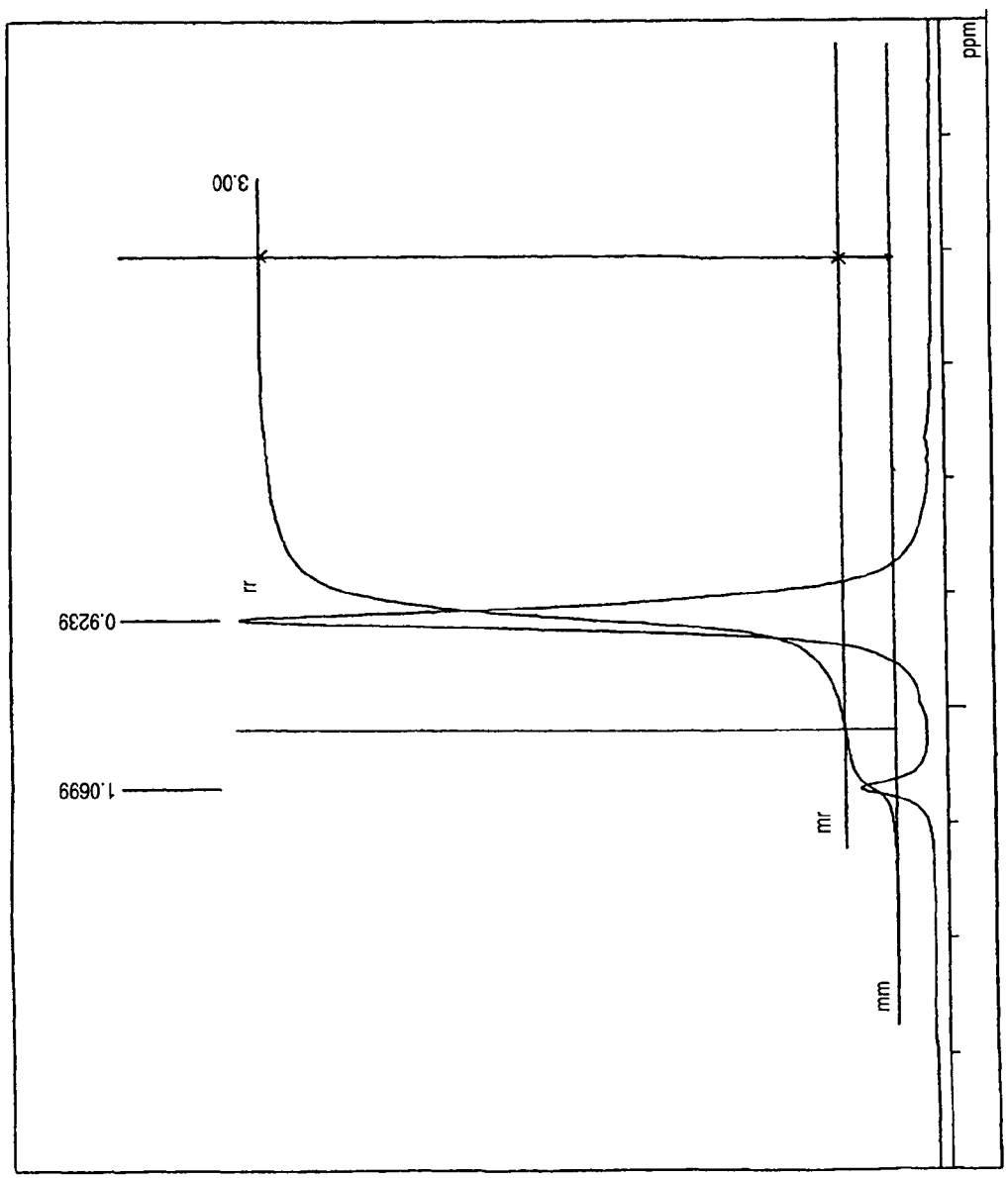
FIG. 2 is an enlarged view of the main chain methyl group used in the calculation of tacticity in 1H-NMR chart of FIG. 1.

1H-NMR chart of the aforementioned polymer (polyvinyl methacrylate) is shown in FIG. 1. An enlarged view of the main chain methyl group used in the calculation of tacticity in this 1H-NMR chart is shown in FIG. 2. For the calculation of the aforementioned tacticity, integration curve of main chain methyl group of polyvinyl methacrylate detected in the range of from 1.2 to 0.9 ppm (in the vicinity of 1.19 ppm (mm), 1.07 ppm (mr), 0.92 ppm (rr)) was used.

Subsequently, about 0.1 g of the polyvinyl methacrylate (PVMA) thus obtained was dipped in 50 ml of ethyl acetate which was then shaken for two days. The components insoluble in ethyl acetate were extracted, and then thoroughly dried. The weight of the insoluble components was then divided by the total amount of the polymers before being dissolved in ethyl acetate to determine the proportion (gel fraction) of insoluble components. The result was 0% by weight.

Preparation of Hologram Recording Material

Into a 50 ml cylindrical sample bottle were charged 0.25 g of the aforementioned PVMA, 0.05 g of bis(η$^5$-2,4-cyclopentadiene-1-yl)bis[2,6-difluoro-3-(1H-pyrrole-1-yl)-phenyl]titanium represented by the following formula (ka-1) as a photopolymerization initiator ("Irgacure 784", produced by Ciba Geigy K.K.), 0.05 g of diethyl sebacate (hereinafter referred to as "SED") (produced by Tokyo Chemical Industry Co., Ltd.) as a plasticizer, 0.05 mg of mercaptobenzoxazole (hereinafter referred to as "MBO") (produced by Sigma-Aldrich Corp.) as a chain transfer agent- and 1.40 g of 1 μl, 2,2-tetrachloroethane (hereinafter referred to as "TCE") (produced by Tokyo Chemical Industry Co., Ltd.) as a solvent. They were then stirred to full dissolution to obtain a TCE solution.

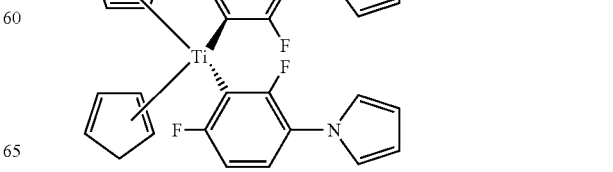

(ka-1)

Subsequently, the aforementioned TCE solution was spin-coated on a blue glass plate using "Spincoater 1H-DX" (trade name of MIKASA Co., Ltd.) in a clean room. Referring to spin-coating conditions, spin coating was effected at 500 rpm for 5 seconds and then at 750 rpm for 10 seconds. Thereafter, the blue glass plate was dried in a dryer which had been predetermined to be 100° C. for about 1 hour to prepare a film made of a hologram recording material having a thickness of about 25 μm on a blue glass plate.

The aforementioned blue glass plate was used without being particularly washed.

Subsequently, the film on the blue glass plate was disposed at a position at which two laser beams produced by equivalently splitting YAG laser beam having a single wavelength of 532 nm and an excellent coherence using a polarization beam splitter cross each other at an angle of 45° after reflected by a reflection mirror to undergo hologram recording.

Referring to the interference band thus formed, the intensity of diffracted light and transmitted light developed when He—Ne laser beam having a wavelength of 633 nm which is not absorbed by the photopolymerization initiator in the material was incident on the film from the back of YAG laser were each detected by a photodetector to determine the diffraction efficiency (%) [=intensity of diffracted light/(intensity of diffracted light+intensity of transmitted light)×100].

As a result, it was found that the diffraction efficiency reached 15.3% at maximum when irradiated with light having an intensity of 25 mW/cm$^2$ and the irradiation time at this point was 479 seconds (exposure: 12 J/cm$^2$). The portion in the sample irradiated with two-flux laser beam was transparent.

Example 2

Evaluation was effected in the same manner as in Example 1 except that the amount of "Irgacure 784", which is a photopolymerization initiator, was changed from 0.05 g to 0.1 g.

As a result, it was found that the diffraction efficiency reached 20.5% at maximum when irradiated with light having an intensity of 25 mW/cm$^2$ and the irradiation time at this point was 439 seconds (exposure: 11.0 J/cm$^2$). The portion in the sample irradiated with two-flux laser beam was transparent.

Example 3

Into a 50 ml cylindrical sample bottle were charged 0.25 g of PVMA obtained in Example 1, 0.0375 g of 2,2'-bis(2-chlorophenyl)-4,4',5,5'-tetraphenyl-1,2'-biimidazole represented by the following formula (ka-2) ("B—CIM", produced by HODOGAYA CHEMICAL CO., LTD.) as a photopolymerization initiator, 0.002 g of 3-ethyl[2-{[3-ethyl-5-phenyl-2(3H)-benzoxazolidene]methyl}-1-butenyl]-5-phenylbenzoxazolium ("NK-1538", produced by Hayashibara Biochemical Labs., Inc.) represented by the following formula (ka-3) as a sensitizing dye, 0.05 g of SED as a plasticizer, 0.05 mg of MBO as a chain transfer agent and 1 g of TCE as a solvent. These components were then stirred to full dissolution to obtain a TCE solution.

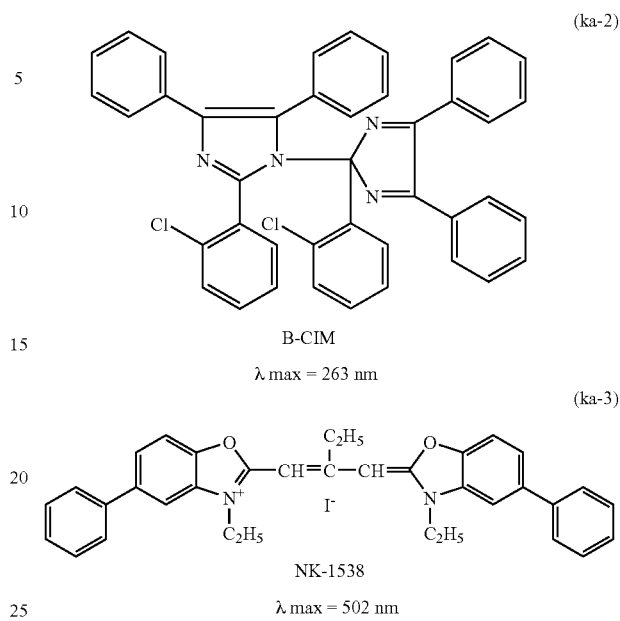

B-CIM

λ max = 263 nm

NK-1538

λ max = 502 nm

Thereafter, a sample was prepared and evaluated in the same manner as Example 1.

As a result, it was found that the diffraction efficiency reached 12.5% at maximum when irradiated with light having an intensity of 25 mW/cm$^2$ and the irradiation time at this point was 393 seconds (exposure: 9.8 J/cm$^2$). The portion in the sample irradiated with two-flux laser beam was transparent.

Example 4

A polymer (PVMA) was obtained in the same manner as in Example 1 except that the amount of the catalyst was changed to 0.0473 g (0.0933 mmol). The aforementioned amount of the catalyst was arranged such that the ratio of monomer/catalyst was 1,784.

The amount of the polymer thus produced was 18.8 g (yield>99% by weight). Further, the number-average molecular weight (Mn), weight-average molecular weight (Mw) and molecular weight distribution (Mw/Mn) of the polymer as determined by GPC (gel permeation chromatography) were 72,600, 521,000 and 7.17, respectively. Moreover, the residual ratio of radically polymerizable side chain vinyl group in the polymer determined by 1H-NMR [residual ratio of vinyl group (%)=vinyl group (4.9 ppm)/methyl group (1.3 to 0.6 ppm)×100] was 100% and the stereoregularity of the main chain was 90% as calculated in terms of syndiotacticity (rr).

Subsequently, about 0.1 g of this PVMA was dipped in 50 ml of ethyl acetate, and then boiled for two days. The components insoluble in ethyl acetate were extracted, and then thoroughly dried. The weight of the insoluble components was then divided by the total amount of the polymers before being dissolved in ethyl acetate to determine the proportion (gel fraction) of insoluble components. The result was 0% by weight.

The aforementioned PVMA was then mixed with various components in the same manner as in Example 1 to prepare a sample which was then evaluated.

As a result, it was found that the diffraction efficiency reached 13.2% at maximum when irradiated with light having an intensity of 25 mW/cm² and the irradiation time at this point was 520 seconds (exposure: 13.0 J/cm²). The portion in the sample irradiated with two-flux laser beam was transparent.

Example 5

A polymer (PVMA) was obtained in the same manner as in Example 1 except that the amount of the catalyst was changed to 0.756 g (1.492 mmol). The aforementioned amount of the catalyst was arranged such that the ratio of monomer/catalyst was 112.

The amount of the polymer thus produced was 18.6 g (yield>99% by weight). Further, the number-average molecular weight (Mn), weight-average molecular weight (Mw) and molecular weight distribution (Mw/Mn) of the polymer as determined by GPC (gel permeation chromatography) were 24,800, 48,700 and 1.96, respectively. Moreover, the residual ratio of radically polymerizable side chain vinyl group in the polymer determined by 1H-NMR [residual ratio of vinyl group (%)=vinyl group (4.9 ppm)/methyl group (1.3 to 0.6 ppm)×100] was 100% and the stereoregularity of the main chain was 92% as calculated in terms of syndiotacticity (rr).

Subsequently, about 0.1 g of the polyvinyl methacrylate (PVMA) thus obtained was dipped in 50 ml of ethyl acetate which was then shaken for two days. The components insoluble in ethyl acetate were extracted, and then thoroughly dried. The weight of the insoluble components was then divided by the total amount of the polymers before being dissolved in ethyl acetate to determine the proportion (gel fraction) of insoluble components. The result was 0% by weight.

The aforementioned PVMA was then mixed with various components in the same manner as in Example 1 to prepare a sample which was then evaluated.

As a result, it was found that the diffraction efficiency reached 14.3% at maximum when irradiated with light having an intensity of 25 mW/cm² and the irradiation time at this point was 204 seconds (exposure: 5.1 J/cm²). The portion in the sample irradiated with two-flux laser beam was transparent.

Example 6

PVMA obtained in Example 5 was mixed with various components in the same manner as in Example 2 to prepare a sample which was then evaluated.

As a result, it was found that the diffraction efficiency reached 16.7% at maximum when irradiated with light having an intensity of 25 mW/cm² and the irradiation time at this point was 176 seconds (exposure: 4.4 J/cm²). The portion in the sample irradiated with two-flux laser beam was transparent.

Example 7

PVMA obtained in Example 5 was mixed with various components in the same manner as in Example 3 to prepare a sample which was then evaluated.

As a result, it was found that the diffraction efficiency reached 12.6% at maximum when irradiated with light having an intensity of 25 mW/cm² and the irradiation time at this point was 220 seconds (exposure: 5.5 J/cm²). The portion in the sample irradiated with two-flux laser beam was transparent.

Example 8

PVMA obtained in Example 1 was mixed with various components in the same manner as in Example 2 and further mixed with 0.0025 g of p-bromostyrene (refractive index: 1.59) (produced by Tokyo Chemical Industry Co., Ltd.) as an ethylenically unsaturated bond-containing monomer to prepare a sample which was then evaluated.

As a result, it was found that the diffraction efficiency reached 15.1% at maximum when irradiated with light having an intensity of 25 mW/cm² and the irradiation time at this point was 185 seconds (exposure: 4.6 J/cm²). The portion in the sample irradiated with two-flux laser beam was transparent.

Example 9

Evaluation was effected in the same manner as in Example 8 except that the ethylenically unsaturated bond-containing monomer described in Example 8 was replaced by 0.0025 g of 9,9-bis[4-(2-acryloxyethoxy)phenyl]fluorene ("AF400", trade name of a product of Kyoeisha Chemical Co., Ltd.).

As a result, it was found that the diffraction efficiency reached 8.8% at maximum when irradiated with light having an intensity of 25 mW/cm² and the irradiation time at this point was 222 seconds (exposure: 5.6 J/cm²). The portion in the sample irradiated with two-flux laser beam was transparent.

Example 10

PVMA obtained in Example 1 was mixed with various components in the same manner as in Example 3 and further mixed with 0.0025 g of p-bromostyrene (refractive index: 1.59) (produced by Tokyo Chemical Industry Co., Ltd.) as an ethylenically unsaturated bond-containing monomer to prepare a sample which was then evaluated.

As a result, it was found that the diffraction efficiency reached 12.6% at maximum when irradiated with light having an intensity of 25 mW/cm² and the irradiation time at this point was 220 seconds (exposure: 5.5 J/cm²). The portion in the sample irradiated with two-flux laser beam was transparent.

Comparative Example 1

A sample was prepared and evaluated in the same manner as in Example 1 except that the equal part of a methyl polymethacrylate (PMMA) free of photoreactive group was used instead of PVMA.

As a result, even when the sample was irradiated with light having an intensity of 25 mW/cm² for about 400 seconds (exposure: 10.0 J/cm²), the diffraction efficiency was less than 0.1%. The portion in the sample irradiated with two-flux laser beam was transparent.

Comparative Example 2

A sample was prepared and evaluated in the same manner as in Example 2 except that the equal part of a polystyrene (PSt) free of photoreactive group was used instead of PVMA.

As a result, the diffraction efficiency reached 0.67% at maximum when irradiated with light having an intensity of 25 mW/cm² and the irradiation time at this point was 447 seconds (exposure: 11.2 J/cm²). The portion in the sample irradiated with two-flux laser beam was transparent.

As can be seen from the results of the aforementioned examples and comparative examples, it is found that, when a polymer (A) having a radically polymerizable side chain vinyl group in the molecule thereof is used and mixed with a photopolymerization initiation source (B) and further with an ethylenically unsaturated bond-containing monomer in accordance with the present invention, a transparent hologram recording material which shows a high diffraction efficiency when irradiated with visible laser beam as compared with those comprising a polymer free of photoreactive group in its molecule can be obtained.

While the invention has been described in detail and with reference to specific embodiments thereof, it will be apparent to one skilled in the art that various changes and modifications can be made therein without departing from the scope thereof.

This application is based on Japanese patent application No. 2005-112136 filed on Apr. 8, 2005, the entire contents thereof being hereby incorporated by reference.

INDUSTRIAL APPLICABILITY

In the present invention, a specific photopolymerization initiation source is added to a specific polymer having a radically polymerizable side chain vinyl group in the molecule thereof, making it possible to provide a high sensitivity over a wide range of wavelength, a high chemical stability and an excellent operability and make efficient modulation (variation) of refractive index by visible laser beam without requiring a complicated step as required conventionally and give an excellent transparency after this modulation as well. In other words, a transparent hologram recording material which shows a high diffraction efficiency by visible laser beam can be provided.

The invention claimed is:

1. A hologram recording material comprising:
a polymer (A) having a radically polymerizable side chain vinyl group in the molecule thereof, said polymer (A) being a polymer of monomers comprising as an essential component an acryl-vinyl monomer represented by the following formula (1):

$$CH_2=C(R^1)C(=O)O-R^2=CH_2 \quad (1)$$

wherein $R^1$ represents a hydrogen atom or methyl group, and $R^2$ represents a saturated or unsaturated hydrocarbon group having 1 to 20 carbon atoms, which may contain hetero atoms or halogen atoms in the molecule thereof; and
a photopolymerization initiation source (B) which generates an active seed by visible light,
wherein the recording material is a hologram recording material, and
wherein the polymer (A) has a stereoregularity of 70% or more in terms of syndiotacticity (rr).

2. The hologram recording material according to claim 1, wherein the polymer (A) is a polymer of monomers comprising the acryl-vinyl monomer represented by the formula (1) in an amount of 20 mol % or more.

3. The hologram recording material according to claim 1, wherein the polymer (A) has a weight-average molecular weight of 80,000 or less.

4. The hologram recording material according to claim 1, wherein the photopolymerization initiation source (B) is a photopolymerization initiator which absorbs visible light to generate an active seed.

5. The hologram recording material according to claim 1, said photopolymerization initiation source (B) comprising a visible light-sensitizing dye and a photopolymerization initiator.

6. The hologram recording material according to claim 4, wherein the photopolymerization initiator is contained in an amount of from 1 to 50% by weight based on the total weight of the hologram recording material.

7. The hologram recording material according to claim 5, wherein the visible light-sensitizing dye is contained in an amount of from 0.1 to 10% by weight based on the total weight of the hologram recording material.

8. The hologram recording material according to claim 1, which further comprises a monomer (C) containing an ethylenically unsaturated bond in addition to the polymer (A) and the photopolymerization initiation source (B).

9. The hologram recording material according to claim 8, wherein the ethylenically unsaturated bond-containing monomer (C) has a refractive index which is different from that of the polymer (A) by 0.005 or more.

10. The hologram recording material according to claim 1, which further comprises a plasticizer and/or a chain transfer agent in addition to the polymer (A), the photopolymerization initiation source (B) and an optional ethylenically unsaturated bond-containing monomer (C).

11. A process for producing a hologram recording material, which comprises:
subjecting monomers comprising as an essential component an acryl-vinyl monomer represented by the following formula (1):

$$CH_2=C(R^1)C(=O)O-R^2=CH_2 \quad (1)$$

wherein $R^1$ represents a hydrogen atom or methyl group; and $R^2$ represents a saturated or unsaturated hydrocarbon group having 1 to 20 carbon atoms, which may contain hetero atoms or halogen atoms in the molecule thereof to anionic polymerization using, as a polymerization initiator, a metal complex catalyst comprising a rare earth metal as an active center to produce a polymer (A) having a radically polymerizable side chain vinyl group in the molecule thereof; and
incorporating a photopolymerization initiation source (B) which generates an active seed by visible light into the polymer (A) to thereby produce a hologram recording material.

12. The process for producing a hologram recording material according to claim 11, wherein the metal complex catalyst comprising a rare earth metal as an active center is a metal complex compound represented by the following formula (2):

$$(Cp1)(Cp2)Mr-(R)p\cdot(L)q \quad (2)$$

wherein Cp1 and Cp2 each independently represent an unsubstituted cyclopentadienyl or a substituted cyclopentadienyl, and Cp1 and Cp2 may be connected to each other directly or through a connecting group;
Mr represents a rare earth metal having a valency of r which is an integer of from 2 to 4;
R represents a hydrogen atom or a straight-chain alkyl group having 1 to 3 carbon atoms;
L represents a solvent having coordinatability; and p and q each represent the number of R's and L's, wherein each of p and q are an integer of from 0 to 2 and are predetermined with respect to r such that the equation r=p+2 is satisfied.

* * * * *